(12) United States Patent
Elin et al.

(10) Patent No.: US 10,797,195 B2
(45) Date of Patent: Oct. 6, 2020

(54) IONIZING RADIATION SENSOR BASED ON FLOAT-ZONE SILICON WITH P-TYPE CONDUCTIVITY

(71) Applicant: PUBLICHNOE AKTSIONERNOE OBSCHESTVO "INTERSOFT EVRAZIYA", Moscow (RU)

(72) Inventors: Vladimir Aleksandrovich Elin, Moscow (RU); Mikhail Moiseevich Merkin, Moscow (RU)

( * ) Notice: Subject to any disclaimer, the term of this patent is extended or adjusted under 35 U.S.C. 154(b) by 74 days.

(21) Appl. No.: 16/302,679

(22) PCT Filed: Mar. 6, 2017

(86) PCT No.: PCT/RU2017/000115
§ 371 (c)(1),
(2) Date: Jan. 18, 2019

(87) PCT Pub. No.: WO2017/200416
PCT Pub. Date: Nov. 23, 2017

(65) Prior Publication Data
US 2019/0148580 A1    May 16, 2019

(30) Foreign Application Priority Data

May 18, 2016 (RU) ................................ 2016119242

(51) Int. Cl.
*H01L 27/14* (2006.01)
*H01L 31/117* (2006.01)
(Continued)

(52) U.S. Cl.
CPC .............. *H01L 31/117* (2013.01); *G01T 1/24* (2013.01); *H01L 31/028* (2013.01); *H01L 31/022408* (2013.01); *H01L 31/1804* (2013.01)

(58) Field of Classification Search
CPC ......... H01L 27/14659; H01L 27/14663; H01L 31/022408; H01L 31/028; H01L 31/115;
(Continued)

(56) References Cited

U.S. PATENT DOCUMENTS

| 4,442,592 | A  | 4/1984 | Kemmer |
| 7,514,762 | B2 | 4/2009 | Deane  |

FOREIGN PATENT DOCUMENTS

| EP | 2535740 A1 | 12/2012 |
| RU | 2545502 C2 | 2/2015  |

(Continued)

*Primary Examiner* — Brook Kebede
(74) *Attorney, Agent, or Firm* — Dmitry S. Kryndushkin, IP Center Skolkovo

(57) ABSTRACT

The invention relates to semiconductor devices for converting ionizing radiation into an electrical signal. The present ionizing radiation sensor has an n+-i-p+ structure, produced using the planar process. The sensor contains an i-region in the form of a high-resistivity substrate of high-purity float-zone silicon with p-type conductivity, having on its front face n+-regions (2, 3), an SiO2 layer (4), aluminium metallization (5), and a passivation layer. On the front face of the substrate (1) n-regions (2) are formed by ion implantation; a masking layer of SiO2 (layer 4) is grown; aluminium metallization (5) is deposited; and a passivation layer (6) is applied. At least one or more n+-regions (2) are situated in the central portion of the front face of the substrate and occupy most of the surface area, forming a sensitive zone of the sensor, and at least two n+-regions and two p+-regions are formed as annular elements (guard rings) (3), arranged concentrically in a non-sensitive zone along the periphery of the substrate (1), in order to reduce the amount of surface current and to provide for a smooth drop in potential from the sensitive region to the periphery of the device. The number of n+-regions (2) that form the matrix, i.e. the sensitive zone, of the sensor is equal to 2k, where k can be (Continued)

View D-D equal to 0—one region. Ports (9) for connecting leads are situated around the edges of the substrate in its non-sensitive region. The n+-regions (2) which form the sensitive zone of the sensor have profiled portions along the edges in the form of a series of recesses (12).

12 Claims, 4 Drawing Sheets

(51) Int. Cl.
*G01T 1/24* (2006.01)
*H01L 31/0224* (2006.01)
*H01L 31/028* (2006.01)
*H01L 31/18* (2006.01)

(58) Field of Classification Search
CPC . H01L 31/117; H01L 31/1804; G01T 1/2018; G01T 1/24
USPC .......................................................... 257/428
See application file for complete search history.

(56) References Cited

FOREIGN PATENT DOCUMENTS

| | | |
|---|---|---|
| RU | 2551257 C2 | 5/2015 |
| RU | 2575939 C2 | 2/2016 |
| WO | WO-2015026261 A1 * 2/2015 | ............ H01L 31/115 |

\* cited by examiner

IONIZING RADIATION SENSOR BASED ON FLOAT-ZONE SILICON WITH P-TYPE CONDUCTIVITY

CROSS-REFERENCE TO RELATED APPLICATION

This application is a National stage of International Application No. PCT/RU2017/000115 filed on Mar. 6, 2017, which claims benefit of priority to Russian Application No. 2016119242 filed on May 18, 2016, both of which are incorporated by reference herein.

FIELD OF THE INVENTION

The invention relates to semiconductor devices for converting ionizing radiation into an electrical signal, the measurement of which allows determining the radiation intensity and the received dose of gamma, proton, electron and alpha radiation. In particular, the invention relates to semiconductor sensing elements (sensors or detectors), representing a diode or a matrix of n-i-p diodes for use in various radiation intensity measuring systems: dosimeters, radiation background exceedance indicators and radiometers, including for individual monitoring of radiation exposure and for warning of radioactive danger. Currently, sensors based on p-i-n and n-i-p diodes continue to be improved with innovative advances in microelectronics technology.

BACKGROUND OF THE INVENTION

Semiconductor sensors based on p-i-n diodes are widely used as particle counters and high-resolution particle energy meters (spectrometers). Their operating principle is based on the fact that when an ionizing particle passes through a sensor (sensitive element), the charge induced in the counter's substance is collected on electrodes.

An important feature of semiconductor counters is their small dimensions. This significantly expanded the possibilities of using such sensors not only in the field of physical experiments, but also in equipment—in process control devices and in medicine.

There is a known sensor comprising n-i-p structure. This known device addresses the challenge of light registration, for which internal amplification is used in elements, wherein amorphous silicon is used as a substrate (i region), while p and n regions represent polycrystalline silicon. As a result, such known device is a matrix of field TFT transistors (U.S. Pat. No. 7,514,762).

As a result, the device can not convert ionizing radiation into an electrical signal, measurement of which allows determining the radiation intensity and the received dose of gamma, proton, electron and alpha radiation.

The prior art has a semiconductor p-i-n diode silicon low-noise detector manufactured using planar technology. It represents methods of manufacturing detectors using planar technology for detecting radiation with semiconductor p-n junctions. However, the described designs of planar semiconductor diodes have a different embodiment (U.S. Pat. No. 4,442,592).

The disadvantage of this known device is low sensitivity and registration speed. As a result, to ensure effective sensitivity and high registration speed for the entire spectrum of gamma radiation, it is necessary to increase the volume of semiconductor in order to increase the probability of gamma quantum hitting and scattering in it and, accordingly, increase the speed of counting the radiation flux particles.

The closest one is a matrix sensor of ionizing radiation which is a p-i-n structure made using planar technology, comprising a high-resistance substrate made of high-purity float zone melting (FZM) silicon of n-type conductivity, the front (working) side of which has p regions formed by ion implantation; $SiO_2$ masking layer; aluminum coating; passivating (protective) layer. Wherein, at least two p regions are located in the substrate's central part and occupy most of the surface area, forming the sensor's sensitive zone, and at least two p regions are made in the form of ring-shaped elements (guard rings) concentrically located in insensitive region at the substrate periphery allowing for reduction of the surface current magnitude and smooth drop of the potential from the device's sensitive region to its periphery. The $SiO_2$ layer has holes to ensure the contact of metal (aluminum coating) with the p region; the passivation layer over the p region located in the substrate's central part has holes to connect leads. On the substrate side opposite to the front surface, there is a layer of n region and metal.

The number of p regions forming the sensor's sensitive region is made equal to $2^n$, where $n=1 \div 8$, wherein p regions have predominantly rectangular shape and are galvanically unrelated and equal in area. The number of holes for connection of leads corresponds to the number of these p regions.

Holes for connection of leads are located at substrate edges in its insensitive region. Wherein, p regions that form the sensor's sensitive region have profiled sections along edges in the form of notches, which ensure the formation of inactive zones for placement of holes for connection of leads.

The total area of holes to ensure the contact of metal (aluminum coating) with p region does not exceed 1% of the sensor's sensitive region to prevent diffusion of aluminum into silicon.

This device uses only monocrystalline silicon. In particular, a plate of high-purity float zone melting silicon is used as a substrate (RU 2551257 prototype).

Disadvantages of the common sensor are considerable duration of radiation background measurement, large dimensions and masses of the sensor, insufficient sensitivity, limited range of registered energies, and inability to register various types of ionizing radiation.

SUMMARY OF THE INVENTION

Object of the invention is to develop a high-performance sensor (sensitive element) for registering ionizing radiation of all types of charged particles and gamma quanta in a wide range of energies and fluxes. In regards to design, the sensor is a single or multiple n-i-p diodes with electrically common p region.

The technical result that solves the object, which the claimed invention is focused on, is the reduction of radiation background measurement time, significant reduction of the sensor's dimensions and mass, expansion of the range of registered energies and the ability to register various types of ionizing radiation while reducing noise and increasing the sensor's sensitivity.

This invention solves the object of increasing the device efficiency by changing the diode polarity. It is known that the main registered component in a p-i-n type sensor is the hole component; the mobility of holes in silicon is about three times less than the mobility of electrons. Accordingly, the charge collection time, or in other words, the duration of the current pulse that occurs during the passage of a particle (if all other conditions are equal: material resistivity, applied voltage, thickness of the sensor, external conditions) for the claimed sensor of n-i-p structure is three times less than for the prototype based on the sensor of p-i-n structure. In addition, the probability of consecutive pulses pileup is significantly reduced and, such that, the invention allows solving the challenge of significant (3 times) increase in the possible counting speed. The device is designed to register any ionizing radiation with the exception of neutron radiation, in particular X-ray and low-energy gamma radiation, and all types of charged particles (electrons, positrons, protons, alpha particles, ions, etc.). The lower limit of the energy of registered particles is no more than 1000 eV, and is practically determined by the noise level of readout electronics. There is no upper limit of the energy registration range; for high-energy (relativistic, with energy more than 2-2.5 rest masses) particles, the energy release in the sensor becomes practically independent of energy, and the average ionization loss is 388 eV/μm, or 194 keV—for a sensor of 500 μm in thickness.

The essence of the invention lies in the fact that the sensor of ionizing radiation comprising n+-i-p+ structure, including i region in the form of high-resistance lightly doped single-crystal substrate made of high-purity float zone melting silicon of p-type conductivity, the front side of which has a sensitive zone in the form at least one n+ region, the outer surface of which is provided with successive masking silicon dioxide coating, aluminum coating and an external passivation layer, and the reverse side of the said substrate has successive layers of high-doped silicon forming the p+ region and aluminum coating to form the indicated layers of n+-i-p+ diode, wherein there is at least one pair of gapped p+ and n+ guard rings under the silicon dioxide coating on the substrate's front surface around the sensitive zone; the above silicone dioxide coating is made with holes for contacting the sensitive n+ region with aluminum coating, and the external passivating layer is made with holes for connection of leads.

Preferably, the sensitive zone of the n+-i-p+ diode has the form of a matrix with the number of galvanically unrelated n+ regions equal to $2^k$, where k is an integer greater than or equal to zero.

Preferably, n+ regions are rectangular.

Preferably, n+ regions are equal in area.

Preferably, the sensor has a number of holes for connection of leads equal to the number of n+ regions.

Preferably, holes for connection of leads are located in the substrate's inactive zone separated from the sensitive zone of the n+-i-p+ diode.

Preferably, the inactive zone and the sensitive zone of the n+-i-p+ diode are separated from each other by recesses made in the substrate.

In particular embodiments, structural elements are made according to planar technology using contact photolithography.

In particular embodiments, structural elements are made according to planar technology using projection photolithography.

Preferably, the total area of holes made in the silicon dioxide coating does not exceed 1% of the sensitive zone and is chosen from the condition of preventing the diffusion of aluminum into silicon.

Preferably, the sensor is made with a total number of p+ and n+ guard rings equal to four, wherein the specified guard rings are located at a distance from each other, which increases while approaching the substrate periphery, and the passivation layer is made of phosphate-silica glass.

Figure 1:
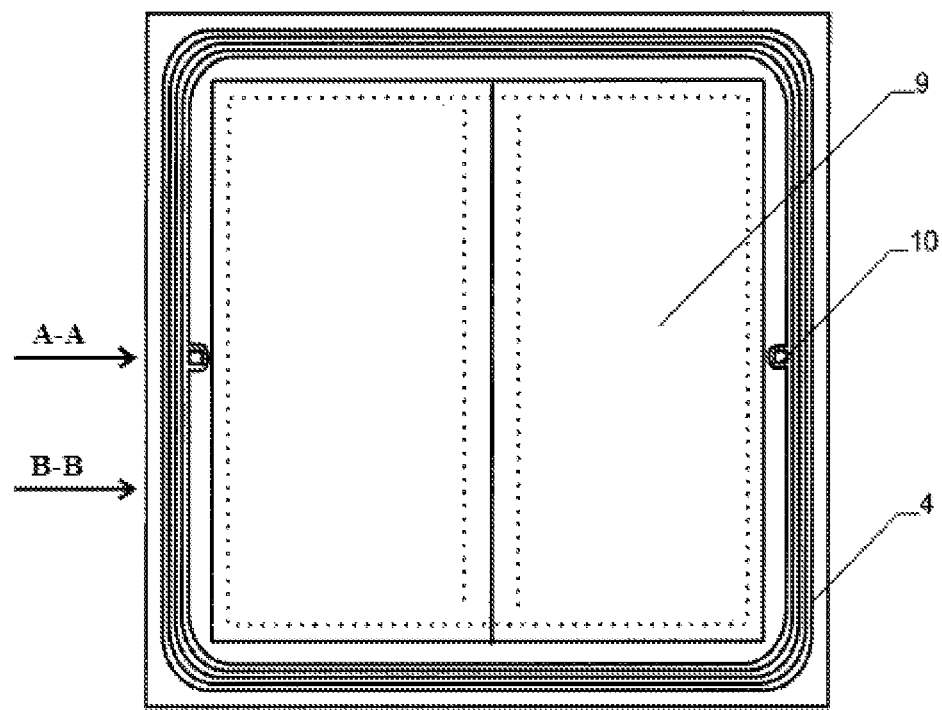
FIG. 1 shows a schematic representation of the claimed device—a plan view, an embodiment of the sensor with two sensitive n+ regions, forming its sensitive zone.
Figure 2:
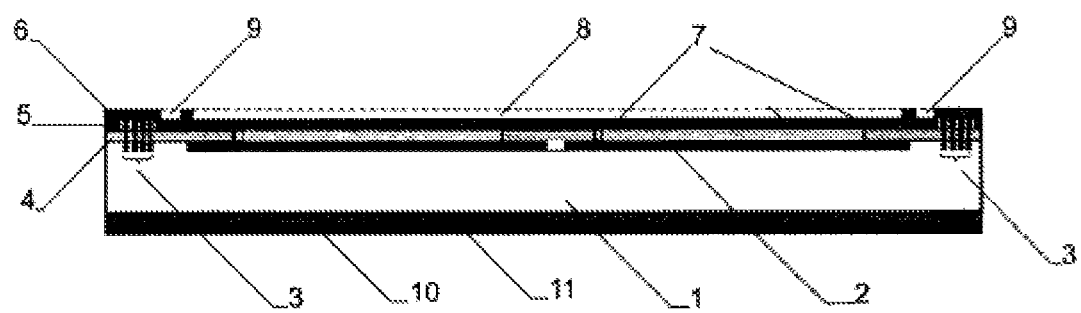
FIGS. 2 and 3 show the A-A and B-B sectional views of FIG. 1, respectively.
Figure 3:
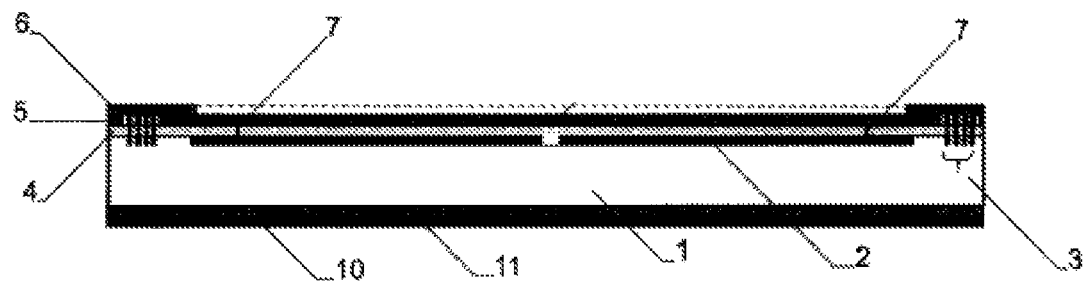
Figure 4:
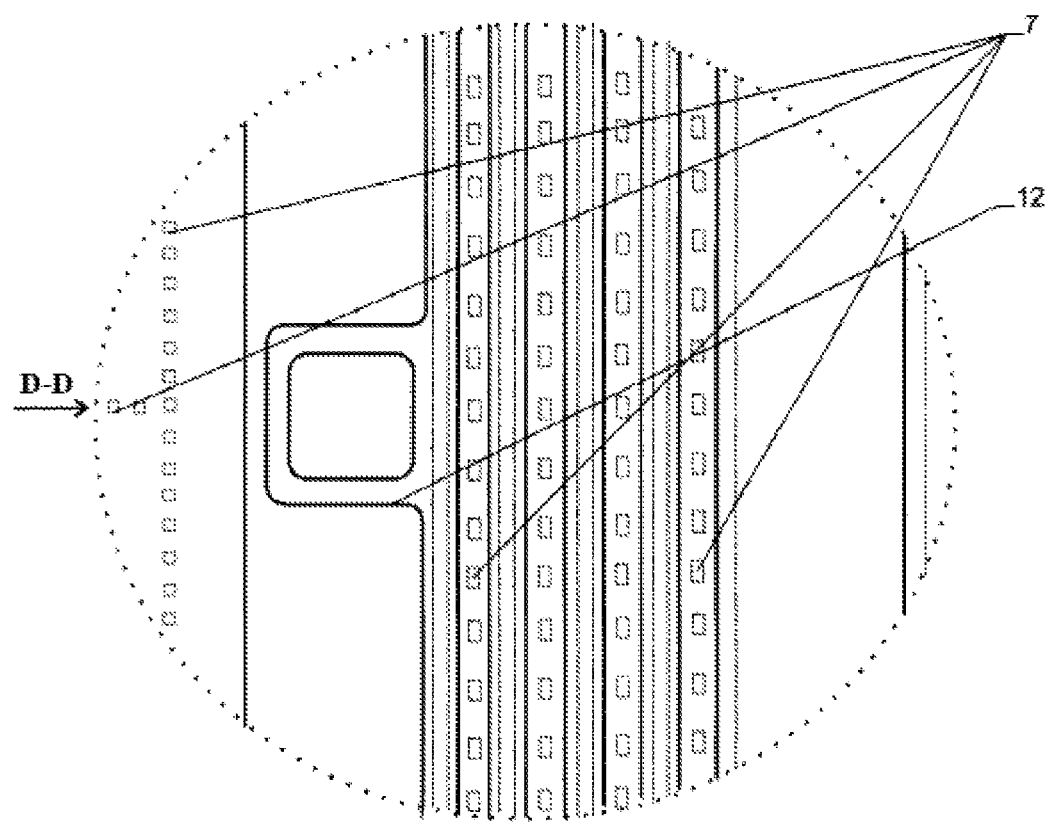
FIG. 4 shows the enlarged section C of FIG. 1.
Figure 5:
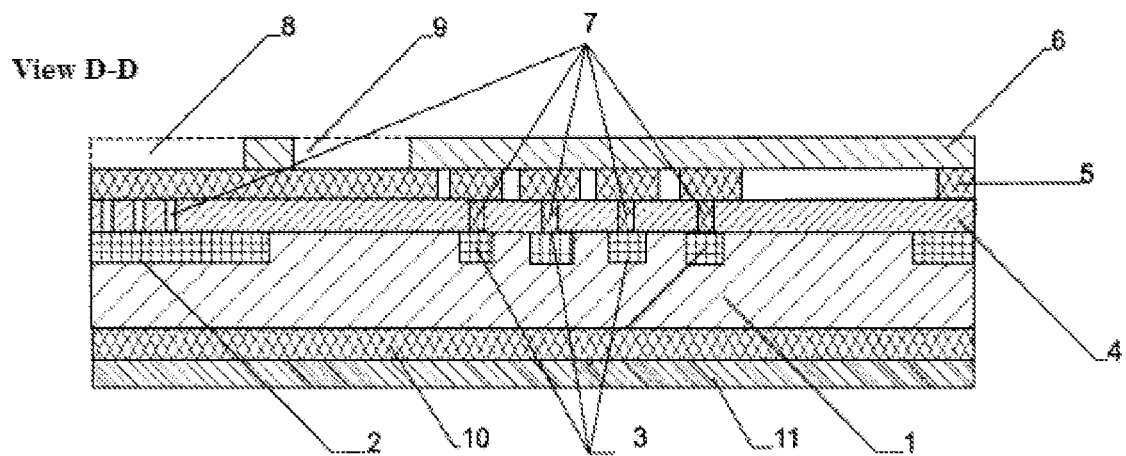
FIG. 5 shows the D-D sectional view of FIG. 4.
Figure 6:
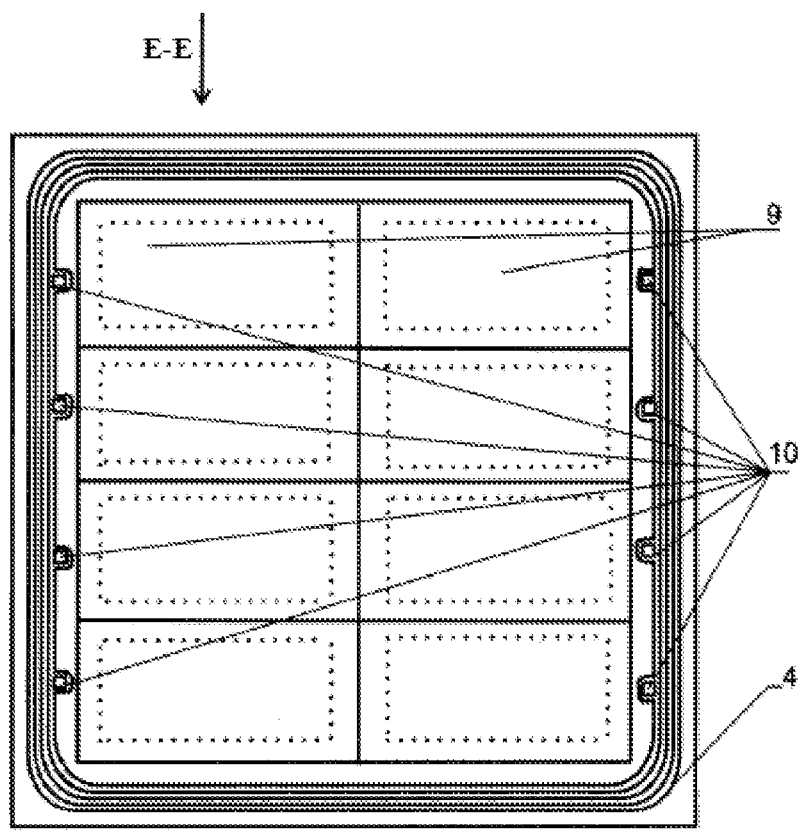
FIG. 6 shows an embodiment of the sensor, wherein its sensitive zone is formed by eight n regions, a plan view.
Figure 7:
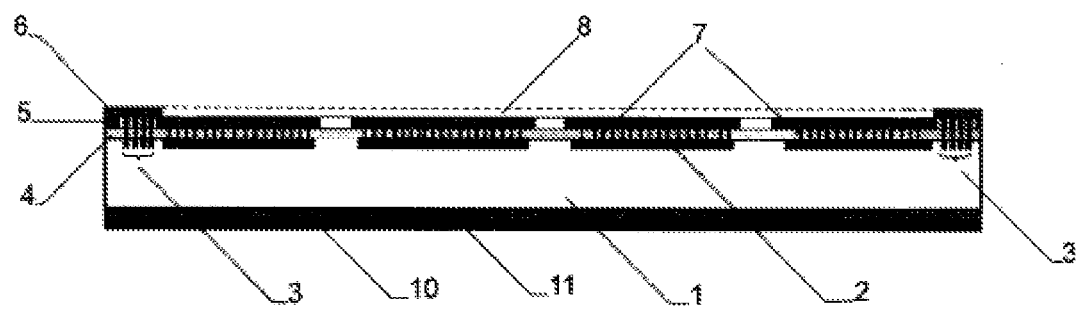
FIG. 7 shows the E-E sectional view of FIG. 6.

Positions on the figures indicate the following objects: 1—i region—high-resistance silicon substrate of p-type conductivity with a low dopant concentration; 2—n+ region located in the substrate's central part, forming the sensor's sensitive zone; 3—alternating p+ and n+ regions, which are guard rings; 4—$SiO_2$ layer (coating); 5—aluminum coating, forming one of the sensor electrodes; 6—passivating (protective) layer of phosphate-silicate glass ($SiO_2+P_2O_5$); 7—holes for contacting the metal (aluminum coating) with n+ region, formed in the $SiO_2$ layer; 8—holes for contacting with the n+-p region during the testing process, located in the passivation layer above the n+ region of the central part of each matrix element; 9—holes for connection of leads; 10—p+ region located on the substrate's back side; 11—aluminum coating on the substrate's back side, forming the second electrode of the sensor; 12—profiled n regions in the form of notches, providing the formation of inactive zones for accommodating holes 9 for connection of leads, one of which is called anode (A), and the back side—cathode (C).

The n+-i-p+ sensor structure, the base of which is a bipolar diode, is based on the fact that between region 2 of electron n+ conductivity and region 10 of hole p+ conductivity there is substrate 1—undoped semiconductor with hole p (positive) conductivity (i region).

DETAILED DESCRIPTION OF THE INVENTION

The claimed matrix sensor (sensitive element) of ionizing radiation is an n+-i-p+ structure made using planar technology (the i region is a lightly doped acceptor silicon). The sensor comprises a high-resistance substrate of high-purity float zone melting (FZM) silicon of p-type (positive) conductivity, on the front (working) side of which there are n+ regions 2, 3, $SiO_2$ layer 4 (coating), aluminum coating 5, passivating (protective) layer 6 of phosphorus silicate glass ($SiO_2+P_2O_5$). The thickness of layers is determined according to the technology of their manufacture and, as a rule, is not more than 0.5+−1.1 μm.

On the front side of substrate 1, there are:
n regions 2 formed by ion implantation;
masking $SiO_2$ layer (layer 4);
aluminum coating 5;
passivating (protective) layer 6.
Wherein, at least one or more n+ regions 2 are located at the front side of the substrate's central part and occupy a large part of the surface area, forming the sensor's sensitive zone, and at least two n+ regions and two p+ regions made in the form of ring-shaped elements (guard rings) 3 are concentrically located in the insensitive region along the substrate 1 periphery to reduce the surface current magnitude and smoothly drop the potential from the sensitive region to the device periphery.

The SiO$_2$ layer 4 has holes 7 to ensure the contact of metal (aluminum coating) with n regions; the passivation layer over n regions located in the substrate's central part has hole 8 for contacting with each n$^+$-p$^-$ region during the testing process and hole 9 for connection with leads. On the substrate 1 side opposite to the front surface, there is layer 10 of p+ region highly doped to 10$^{20}$ atoms of acceptor impurity per cm$^3$ with a thickness of 2÷4 μm, and layer 11 of aluminum coating with a thickness of 0.9÷1.1 μm.

The total area of holes 7 for contacting metal (aluminum coating) with p region does not exceed 1% of the detector's sensitive zone to prevent diffusion of aluminum into silicon.

The number of n+ regions 2 forming the matrix (the sensor's sensitive zone) is equal to 2$^k$, where k can be equal to 0—one region, and the upper value is determined by the challenge and dimensions of the sensor and is limited only by capabilities of the technological process. Wherein, n+ regions 2 predominantly have rectangular shape, are galvanically unrelated and equal in area. The number of holes 9 for connection of leads corresponds to the number of p n+ regions 2.

The number of such n+ regions 2 can vary from 1 to 1024. The specified number of sensitive independent regions 2 may be larger. This number is determined only by the reasonable need to reduce the noise and, accordingly, to increase the number of readout channels. Obviously, an increase in the number of readout channels leads to an increase in the energy consumption of dosimeter-radiometer as a whole. So, in case of household appliances it is reasonable to limited to a small number of regions 2 serving as matrix elements (4 or 8); in case of professional or fixed devices with a large total sensor area, which require high measurement accuracy, the number of channels can be significantly increased. The modern electronics market offers single crystal amplifiers with up to 128 channels.

Holes 9 for connection of leads are located at substrate edges in its insensitive zone. Wherein, n+ regions 2 that form the sensor's sensitive zone have profiled sections along edges in the form of the row of notches 12, which ensure the formation of inactive zones for placement of holes for connection of leads.

The total area of holes 9 for contacting metal (aluminum coating) with n+ region 2 does not exceed 1% of the sensor's sensitive zone to prevent diffusion of aluminum into silicon.

A plate of high-purity float zone melting (FZM) silicon with a specific resistance of 3÷12 kOhm/cm and thickness of 250÷1000 μm is used as a silicon substrate. The number of ring-shaped elements (guard rings) 3 is chosen equal to 4 (two n+ and two p+) located at a distance from each other, which increases while approaching the substrate periphery. The number and configuration of guard rings 3 are determined taking into account the peculiarities of technological process. The system of guard rings should ensure a smooth drop in potential from the sensor's active region to its edge. At least two n+ regions and two p+ regions of guard rings 3 made in the form of ring-shaped elements are located in the insensitive zone along the substrate 1 periphery around n+ regions 2 and provide a reduction in surface current and a smooth drop in potential from the device's sensitive region to its periphery.

In one embodiment of the sensor, the width of ring-shaped elements 3 is chosen equal to 25 μm, wherein the distance between the first and second elements 3 is chosen equal to 40 μm, between the second and third elements −50 μm, between the third and fourth elements −70 μm, wherein the first element 3 is separated from the border of the sensitive p region 10 at a distance of 40 μm. Wherein, these parameters can vary in a wide range. When manufacturing the sensor, the accuracy of specified dimensions is determined by the accuracy of manufacturing photographic masks and is ±0.1 μm.

Dimensions of the working surface are determined according to dimensions of plate 1 and, for example, for plates with a diameter of 150 mm can be up to 102×102 mm$^2$, wherein the overall dimensions of the active zone surface are 100×100 mm$^2$, the sensor thickness is 250÷1000 μm (determined according to the thickness of plate 1), the region occupied by ring-shaped elements 3 is not more than 1 mm along the substrate 1 perimeter. This sensor design ensures the achievement of the following electrical characteristics: the reverse bias from 40÷200 V to achieve the mode of complete depletion, depending on the specific resistance and thickness of the sensor; operating mode characterized by reverse bias at full depletion; operating voltage determined according to the value of complete depletion voltage ($V_{CD}$): Voper=$V_{CD}$+20 V; breakdown voltage, at least -2-$V_{CD}$; dark current at operating voltage, not more than −200 nA/cm; wherein, these parameters are measured at a temperature of 20±2° C.

The claimed sensors are manufactured using planar technology, which is a set of technological operations, by which structures of planar semiconductor sensors are formed on only one side of a plate, cut from a silicon single crystal with a diameter of up to 150 mm. In particular, the invention can be implemented according to a technology close to that presented in publications of Kemmer (Kemmer J. "Fabrication of low noise silicon radiation detectors by the planar process"/Nuclear Instruments and Methods.—1980. —V. 169. —Pp. 499-502.).

The planar technology is based on the creation of a substrate of regions with different types of conductivity or with different concentrations of impurities of the same type in the near-surface layer, which together form the sensor's structure. Regions of structures are created by the local introduction of impurities into the substrate (by diffusion from the gas phase or by ion implantation) carried out through a mask (usually made of SiO$_2$ film) formed by photolithography. By consistently carrying out processes of oxidation (creation of SiO$_2$ film), photolithography and introduction of impurities, we can create the doped region of any desired configuration, as well as regions of different conductivity type (or different impurity concentration). The planar technology makes it possible to simultaneously produce a large number (up to several hundred or even thousands) of identical discrete semiconductor devices (for example, sensors) or integrated circuits on a single plate and in a single technological process. Batch processing provides good reproducibility of device parameters and high performance at a relatively low cost of products.

The sensor of ionizing radiation operates as follows.

The sensor operation is based on the fact that when a reverse bias voltage is applied, the i region is completely depleted by carriers and the diode ceases to pass current (is locked). Basically, in case of reverse bias, the i region is an insulator due to the absence of free charge carriers, and the magnitude of flowing current becomes negligible.

When passing through the i region, ionizing radiation (quanta) create a cloud of ionization along its trajectory, causing the formation of electron-hole pairs. Getting into the electric field, charge carriers begin to move to high-doped p+ and n+ regions 10 and 2, creating a pulse of electric current, which can be detected by an external circuit. The conductivity of a bipolar diode depends on the wavelength, intensity and modulation frequency of the incident radiation.

Entering the sensor material, quanta of X-ray and low-energy gamma radiation interact with it, which leads to the birth of (depending on the incident quantum energy): photoelectron, Compton electron or electron-positron pair. The probability of this process is 1÷3%, but taking into account the fact that the probability of detecting a charged particle (electron, positron, proton, alpha particle, etc.) is 1, this is quite enough for confident registration of ionizing gamma radiation even at background level with accuracy at least 20% in 1÷2 minutes of measurement. Charged particles penetrate the sensor's sensitive region and generate electron-hole pairs in it. Under the action of an electric field applied to the semiconductor sensor, charge carriers (electrons) are "resolved" and moved to electrodes. As a result, an electrical pulse occurs in the external circuit of a semiconductor detector, which is registered by a charge-sensitive preamplifier, converted into a voltage drop at its output, and then transmitted to a signal processing unit (not shown).

To test the sensor performance, prototypes with 2, 4 and 8 matrix elements (regions 2) were created, in which the semiconductor sensor (detector) is a high-voltage n+-i-p+ diode in the form of a one-sided structure made using planar technology on a high-purity FZM silicon substrate with specific resistance of: 3÷4 kOhm/cm, dimensions of 12×12 mm and a thickness of 450 μm. The flat signal $n^+$-$p^-$ junction is an ion-implanted n+ region with high concentration of phosphorus atoms. Around the flat signal $n^+$-$p^-$ junction, which occupies a large part of the substrate (the active region size was 10×10 mm, wherein the sizes of each p region were 50, 25 and 12.5 mm$^2$, respectively), there are guard ring-shaped p+-$p^-$ and $n^+$-$p^-$ junctions made in a similar way as the flat signal $n^+$-$p^-$ junction located in the substrate's central part. The region occupied by guard rings was no more than 1 mm along the perimeter. Metal electrodes are made of aluminum. On the substrate side opposite to the front surface, there is highly doped (to $10^{20}$ atoms of acceptor impurity per cm$^3$) layer $p^+$-10 with a thickness of 2÷4 μm, and layer of aluminum coating 11 with a thickness of 0.9÷1.1 μm.

When manufacturing the sensor using planar technology, a set of 5 contact photolithography masks was used, the first of which is a photomask for forming the n+ region; the second—for forming guard high-doped concentric p+ regions; the third—for forming contacts to the n+ region of the diode and guard rings along the periphery on the plate's front side; the fourth—for Al metal coating, the fifth—for forming contacts to the metal coating. Patterns are listed in order of their use in the process. Wherein, in the first and second photomasks, the minimum width of peripheral rings was 25 μm; in the third photomask for forming contacts to the n+ diode and guard rings along the periphery on the plate's front side, the minimum contact size was: −25×25 μm$^2$; along the periphery to guard rings −10×40 and 40×10 μm$^2$; in the fourth photomask for Al metal coating, the minimum width of rings along the periphery of the diode was 20 μm; dimensions of the fifth photomask for forming contacts to the central metal coating area are not critical.

Manufactured devices had the following electrical characteristics:

Operating mode—reverse bias at full depletion.

Operating voltage is determined based on the value of complete depletion voltage $V_{CD}$: Voper=$V_{CD}$+20 V;

Breakdown voltage is no less than 2-$V_{CD}$;

Dark current at operating voltage is not more than 200 nA/cm$^2$;

All measurements were carried out at a temperature of 20±2° C. On the plate, there are test structures to determine the specific resistance of p region by the four-point method. It was not envisaged to connect guard rings—their main task is to prevent the occurrence of surface current from n+ region to the sensor's edge due to the induced potential.

As can be seen from the said examples, the implementation of the invention reduces radiation background measurement time, significantly reduces the sensor's dimensions and mass, expands the range of registered energies and the ability to register various types of ionizing radiation while reducing noise and increasing the sensor's sensitivity.

The sensor is sensitive to all types of ionizing radiation, with the exception of neutrons; the lower limit of the energy of detected particles is no more than 1000 eV and is practically determined according to the noise level of read-out electronics. There is no upper limit of the energy registration range; for high-energy (relativistic, with energy more than 2-2.5 rest masses) single-charged particles, the energy release in the sensor becomes practically independent of energy, and the average ionization loss is 388 eV/μm, or 194 keV—for a sensor of 500 μm in thickness. The energy release from multiply charged ions is proportional to the square of charge. Registration of a signal of this level represents no difficulty for modern electronics.

The method for manufacturing the sensor of ionizing radiation using planar technology includes the manufacture of a set of 5 contact (or projection) photolithography masks, the first of which is a photomask for forming n+ region, the second—for forming p+ guard elements, the third—for forming contacts to the diode n+ region and guard rings along the periphery on the plate's front side, the fourth—for Al metal coating, the fifth—for forming contacts to the metal coating.

The sensor made in accordance with the present invention can be used in various portable autonomous devices designed to register and/or measure ionizing radiation. Wherein, the sensor has small dimensions in combination with a wide working temperature range, high counting speed and sensitivity, high radiation resistance, wide range of measurements, no need for periodic maintenance, low power consumption, low voltage power supply and low noise performance.

The invention claimed is:

1. A sensor of ionizing radiation comprising a n+-i-p+ structure, the n+-i-p+ structure comprising i-region constituting a high-resistance lightly doped single-crystal substrate made of high-purity float zone melting silicon of p-type conductivity, a front side of the substrate has a sensitive zone constituting at least one n+ region, an outer surface of the zone is provided with sequentially located masking silicon dioxide coating, aluminum coating and an external passivating layer, and a reverse side of the said substrate has successive layers of a highly doped silicon forming a p+ region and aluminum coating, whereby the substrate with the indicated layers forms n+-i-p+ diode, wherein there is at least one pair of gapped p+ and n+ guard rings under the silicon dioxide coating on the substrate's front side around the sensitive zone; the said silicone dioxide coating is made with holes for contacting the sensitive n+ region with aluminum coating, and the external passivating layer is made with holes for connection of leads.

2. The sensor according to claim 1, wherein the sensitive zone of the n+-i-p+ diode shaped as a matrix with an amount of galvanically unrelated n+ regions equals to 2k, where k is an integer greater than or equal to zero.

3. The sensor according to claim 2, wherein n+ regions are rectangular.

4. The sensor according to claim 2, wherein n+ regions are equal in area.

5. The sensor according to claim 1, characterized in that it has an amount of the holes for connection of leads that equals to the amount of n+ regions.

6. The sensor according to claim 1, wherein the holes for connection of leads are located in a substrate's inactive zone separated from the sensitive zone of the n+-i-p+ diode.

7. The sensor according to claim 6, wherein the inactive zone and the sensitive zone of the n+-i-p+ diode are separated from each other by recesses made within the substrate.

8. The sensor according to claim 1, wherein structural elements of the sensor are made according to planar technology using contact photolithography.

9. The sensor according to claim 1, wherein structural elements of the sensor are made according to planar technology using projection photolithography.

10. The sensor according to claim 1, wherein total area of the holes made in the silicon dioxide coating does not exceed 1% of the sensitive zone and is chosen to prevent diffusion of aluminum into silicon.

11. The sensor according to claim 1, characterized in that it has a total number of p+ and n+ guard rings equal to four, wherein said guard rings are located at a distance from each other, which increases while approaching a periphery of the substrate.

12. The sensor according to claim 1, wherein the passivating layer is made of a phosphate-silica glass.

* * * * *